(12) United States Patent
Kropiewnicki

(10) Patent No.: US 10,734,751 B2
(45) Date of Patent: Aug. 4, 2020

(54) CURRENT MEASUREMENT IN THE INSULATING BODY

(71) Applicant: HARTING Electric GmbH & Co. KG, Espelkamp (DE)

(72) Inventor: Norbert Kropiewnicki, Bielefeld (DE)

(73) Assignee: Harting Electric GmbH & Co. KG, Espelkamp (DE)

( * ) Notice: Subject to any disclaimer, the term of this patent is extended or adjusted under 35 U.S.C. 154(b) by 42 days.

(21) Appl. No.: 16/083,432

(22) PCT Filed: Mar. 1, 2017

(86) PCT No.: PCT/DE2017/100162
§ 371 (c)(1),
(2) Date: Sep. 7, 2018

(87) PCT Pub. No.: WO2017/152908
PCT Pub. Date: Sep. 14, 2017

(65) Prior Publication Data
US 2019/0081433 A1 Mar. 14, 2019

(30) Foreign Application Priority Data
Mar. 9, 2016 (DE) .................. 10 2016 104 267

(51) Int. Cl.
*H01R 13/58* (2006.01)
*H01R 13/518* (2006.01)
(Continued)

(52) U.S. Cl.
CPC ......... *H01R 13/518* (2013.01); *G01R 15/202* (2013.01); *G01R 33/07* (2013.01);
(Continued)

(58) Field of Classification Search
CPC .............. H01R 13/5808; H01R 103/00; H01R 13/506; H01R 13/516; H01R 13/518; H01R 13/6683
(Continued)

(56) References Cited

U.S. PATENT DOCUMENTS 5,697,819 A 12/1997 Hatagishi
6,472,878 B1 10/2002 Bruchmann
(Continued)

FOREIGN PATENT DOCUMENTS

CN 103 001 072 A 3/2013
DE 10 2006 006 314 A1 11/2006
(Continued)

OTHER PUBLICATIONS

German Office Action, dated Mar. 1, 2017, for German Application No. 10 2016 104 267.6, 4 pages.
(Continued)

*Primary Examiner* — Phuong Chi Thi Nguyen
(74) *Attorney, Agent, or Firm* — Seed IP Law Group LLP

(57) ABSTRACT

An insulating body or a module for a modular industrial plug-in connector is provided. At least two electrical contact elements are arranged in the module, each of which is assigned a Hall sensor for current measurement. The Hall sensors are electromagnetically shielded from one another within the module by shielding arms.

9 Claims, 3 Drawing Sheets

(51) Int. Cl.
*G01R 15/20* (2006.01)
*H01R 13/514* (2006.01)
*H01R 13/66* (2006.01)
*G01R 33/07* (2006.01)

(52) U.S. Cl.
CPC ......... *G01R 33/072* (2013.01); *H01R 13/514* (2013.01); *H01R 13/6658* (2013.01); *H01R 13/6683* (2013.01)

(58) Field of Classification Search
USPC ................. 439/455–453, 466, 465, 468, 731
See application file for complete search history.

(56) References Cited

U.S. PATENT DOCUMENTS

| | | | | |
|---|---|---|---|---|
| 6,780,069 | B2* | 8/2004 | Scherer | H01R 13/514 |
| | | | | 439/595 |
| 9,431,776 | B2* | 8/2016 | Futakuchi | H01R 13/6683 |
| 9,577,388 | B2* | 2/2017 | Umetsu | G01R 33/093 |
| 2010/0112866 | A1 | 5/2010 | Friedhof et al. | |
| 2012/0217964 | A1 | 8/2012 | Iizuka et al. | |
| 2014/0357126 | A1 | 12/2014 | Suzuki et al. | |
| 2015/0233980 | A1 | 8/2015 | Umetsu et al. | |
| 2016/0006163 | A1* | 1/2016 | Tashiro | H01R 13/5205 |
| | | | | 439/587 |
| 2016/0093980 | A1 | 3/2016 | Beischer et al. | |
| 2017/0141518 | A1 | 5/2017 | Brüx et al. | |

FOREIGN PATENT DOCUMENTS

| | | |
|---|---|---|
| DE | 20 2007 018 306 U1 | 6/2008 |
| DE | 20 2007 018 305 U1 | 7/2008 |
| DE | 20 2013 103 611 U1 | 11/2013 |
| EP | 2 782 195 A1 | 9/2014 |
| RU | 2 353 937 C1 | 4/2009 |
| WO | 2014/202050 A1 | 12/2014 |
| WO | 2015/149757 A2 | 10/2015 |

OTHER PUBLICATIONS

International Search Report and Written Opinion, dated May 15, 2017, for International Application No. PCT/DE2017/100162, 14 pages. (with English Translation of Search Report).
Russian Office Action, dated Mar. 7, 2019, for Russian Application No. 2018134029/07(055957), 4 pages.
Chinese Office Action, dated Apr. 11, 2019, for Chinese Application No. 201780014296.4, 6 pages.

* cited by examiner

CURRENT MEASUREMENT IN THE INSULATING BODY

BACKGROUND

Technical Field

The disclosure relates to an in insulating body for a plug connector.

Insulating bodies of this type are installed by way of example in plug connector housings. In the case of modular industrial plug connectors, different types of insulating bodies are inserted into so-called holding frames and subsequently installed in a plug connector housing. The insulating bodies are subsequently also referred to as modules.

Description of the Related Art

WO 2015/149757 A2 illustrates a holding frame that may receive individual insulating bodies having sensors, so-called modules. Owing to the required compact construction of the insulating body, it is difficult to position sensors within the insulating body.

BRIEF SUMMARY

Embodiments of the invention provide a compact and simultaneously cost-effective insulating body, wherein it is possible to monitor the currents that are flowing through individual contact elements received in the insulating body.

The insulating body in accordance with an embodiment of the invention is provided for a plug connector. The insulating body may be installed directly in a plug connector housing. However, the insulating body is generally inserted as a module in a modular industrial plug connector. For this purpose, multiple different types of modules are brought together in an articulated frame, as is illustrated by way of example in WO 2014/202050 A1.

At least two electrical contact elements are arranged in the insulating body. The term 'electrical' in this case means that an electric current may flow via the contact elements if the plug connector is plugged into a mating plug or into a socket.

The insulating body in accordance with an embodiment of the invention comprises at least two sensors for measuring current, wherein each sensor is allocated to an electrical contact element. The number of sensors corresponds to the number of electrical contact elements that are present in the insulating body. Each sensor is allocated to precisely one electrical contact element. It is possible to provide further non-electrical contact elements, by way of example pneumatic contact elements, which are not allocated a sensor.

In a particularly advantageous embodiment, the insulating body is embodied from a synthetic material base body and two lateral parts, a first lateral part and a second lateral part. The two lateral parts may be manufactured from a synthetic material, wherein the first lateral part comprises at least in regions a metal core. Components of this type are inexpensive to produce.

At least two shield arms protrude advantageously in a perpendicular manner from the first lateral part. The shield arms are guided through cut-outs in the base body. The core that is metal in regions is preferably arranged in the shield arms. At least four shield arms may protrude in a perpendicular manner from the first lateral part, wherein in each case two shield arms are combined to form a shield arm pair. A connecting piece that is provided for this purpose on the second lateral part engages between the ends of the shield arm pair, as a result of which a wedging effect is produced.

The insulating body may further comprise a circuit board. The circuit board comprises cut-outs. The shield arms or the shield arm pairs of the first lateral part engage in each case though the cut-outs of the circuit board. The circuit board is arranged parallel to the lateral parts and the base body as a result of the above described wedging effect of the shield arm pairs and the allocated connecting pieces. The lateral parts comprise on the narrow sides in each case latching protrusions that may latch into the latching cut-outs that are provided for this purpose in the base body. As a result, it is possible to assemble the insulating body in a particularly simple manner.

It is particularly advantageous to mount the sensors on the circuit board. The circuit board may also comprise an electronic evaluating system. The sensors are shielded from one another in an electromagnetic manner by the shield arms. Each sensor is allocated to an electrical contact element and may perform current measurements in a manner undisturbed by the adjacent sensor.

The circuit board comprises so-called outputs which may be used to retrieve or tap the measured data.

The sensors may each be a Hall sensor. Sensors of this type also provide measured values when the current flow is constant, in contrast to sensors that comprise coils.

It is particularly advantageous if the insulating body is provided with connecting pieces that are formed as an integral part thereof and the insulating body may be fastened in a holding frame of an industrial plug connector by said connecting pieces. As a result, the insulating body may be integrated in a modular industrial plug connector.

BRIEF DESCRIPTION OF THE SEVERAL VIEWS OF THE DRAWINGS

An exemplary embodiment of the disclosure is illustrated in the drawings and is explained in detail below. In the drawings.

The figures illustrate in part simplified, schematic views. In part, identical reference numerals are used for identical, but where appropriate non-identical, elements. Different views of identical elements could be scaled differently.

DETAILED DESCRIPTION

Figure 1:
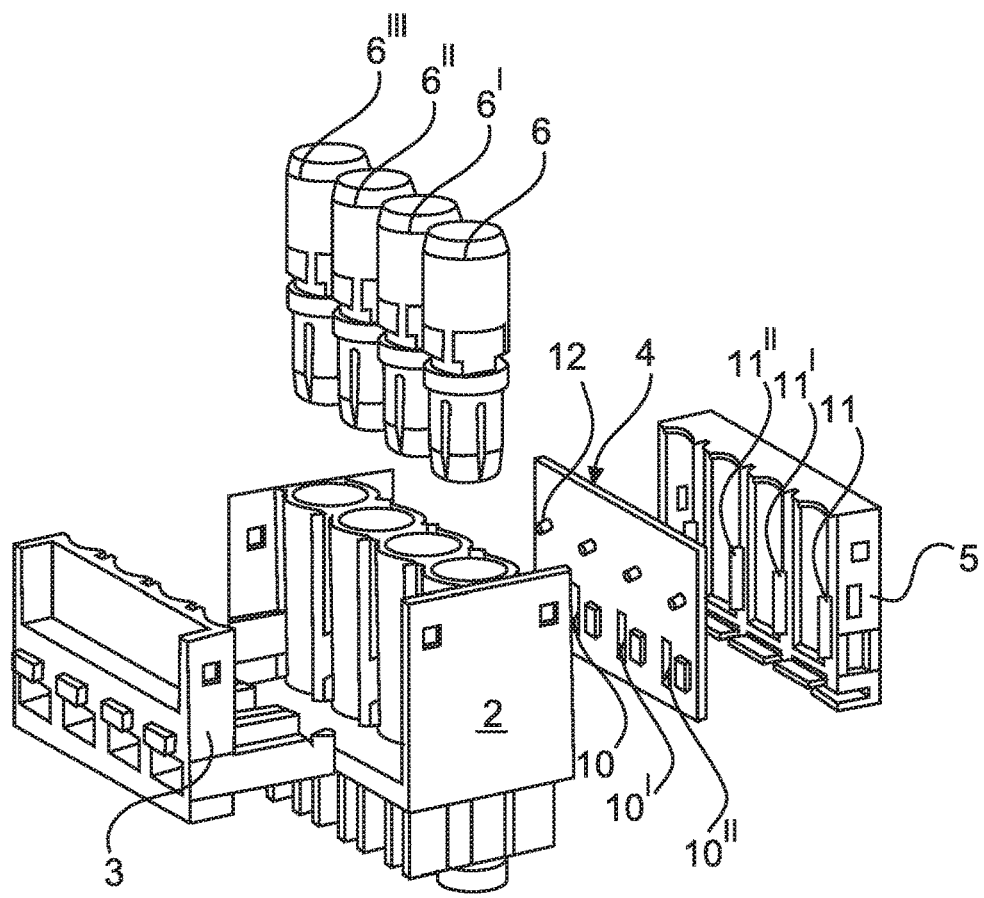
FIG. 1 illustrates a perspective exploded view of an insulating body in accordance with the exemplary embodiment of the invention.

FIG. 1 illustrates an exploded view of the insulating body 1 in accordance with an exemplary embodiment of the invention. The insulating body 1 is embodied essentially from a synthetic material base body 2, a first lateral part 3, a circuit board 4 and a second lateral part 5. Electrical contact elements 6, 6', 6", 6''' are arranged in the base body 2.

The first lateral part 3 is essentially formed from a synthetic material. Shield arms 7 protrude out of the first lateral part 3. U-shaped metal shield strips 18 are introduced within the shield arms 7. The synthetic material shape of the first lateral part 3 has for this purpose hollow shield arm shapes that are open at the rear for sliding in the metal shield strips 18. The shield arms 7 thus have a metal core. In this exemplary embodiment, the metal shield strips 18 are slid into the first lateral part 3. However, it is likewise conceivable to introduce the metal shield strips 18 by an injection molding process.

Figure 2:
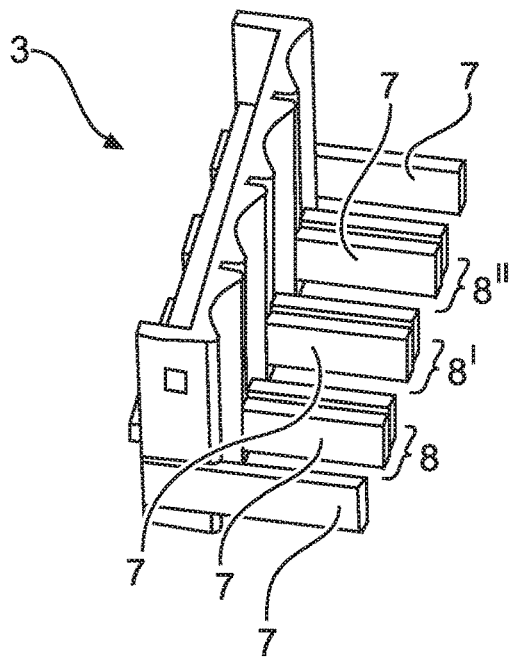
FIG. 2 illustrates a perspective view of a first lateral part thereof.
Figure 3:
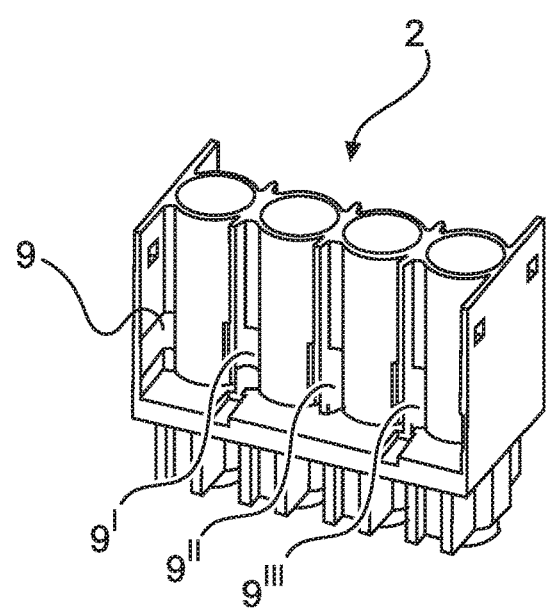
FIG. 3 illustrates a perspective view of a base body thereof.
Figure 4:
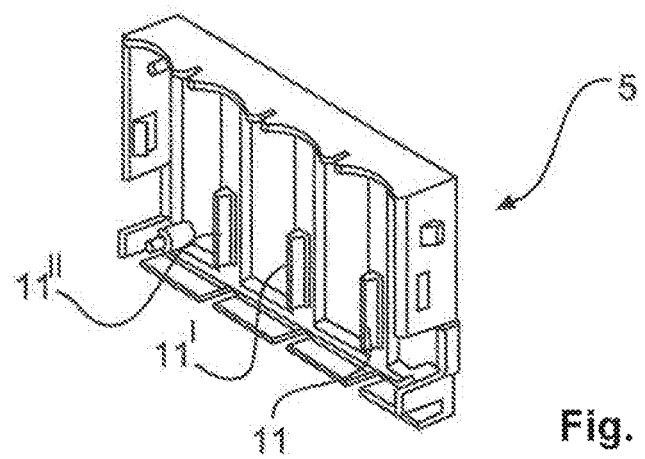
FIG. 4 illustrates a perspective view of a second lateral part thereof.

It is apparent in FIG. 2 that two shield arms 7 protrude at the end from the first lateral part 3. Three shield arm pairs 8 are arranged between the shield arms 7 that are provided at the end, wherein each shield arm pair 8 is formed from two individual shield arms 7 respectively.

The shield arms 7 and the shield arm pairs 8 may engage with the second lateral part 5 through the cut-outs 9 in the base body 2 and through the cut-outs 10 in the circuit board 4. A connecting piece slides between the ends of the shield arm pairs 8, as a result of which the shield arms 7 of the shield arm pairs 8 are pushed outwards and a wedging effect is created. The circuit board 4 is aligned in a precise-fit manner by the shield arms 7 of the shield arm pairs 8, said shield arms 7 being pushed outwards. As a result of this precise-fit alignment, it is possible for the circuit board 4 to slide into their intended position within the second lateral part 5. It is important that the circuit board 4 is guided and locked in a defined position relative to the contact elements 6, 6', 6", 6''' as a result of the functional geometry of said circuit board 4. As a result, it is possible to ensure that the measuring technology supplies reliable values and measurement errors do not occur. By virtue of the illustrated construction it is guaranteed that, even following a mechanical loading, the positioning of the circuit board 4 and the sensors 13, 13', 13", 13''' that are installed thereon remains unchanged relative to the contact elements 6, 6', 6", 6'''.

As the circuit board 4 and the second lateral part 5 slide together, lugs 15 in the corner positions of the second lateral part 5 engage in associated receiving openings 16 of the circuit board 4. If the circuit board 4 is lying on the inner face of the second lateral part 5, the circuit board 4 latches behind latching arms 17.

In the aligned state, spring contacts 12, 12', 12", 12''' may engage on the circuit board 4 with the contact elements 6, 6', 6", 6''' so as to tap-off the voltage. The spring contacts 12, 12', 12", 12''' and the allocated electrical contact elements 6, 6', 6", 6''' are in an electrically conductive contact with one another.

It is possible using the voltage information and the current measurement to indicate the value of the electrical power. This requires that the circuit board together with the sensors 13, 13', 13", 13''' and the contact elements 6, 6', 6", 6''' are arranged or moved into a pre-defined position.

Figure 8:
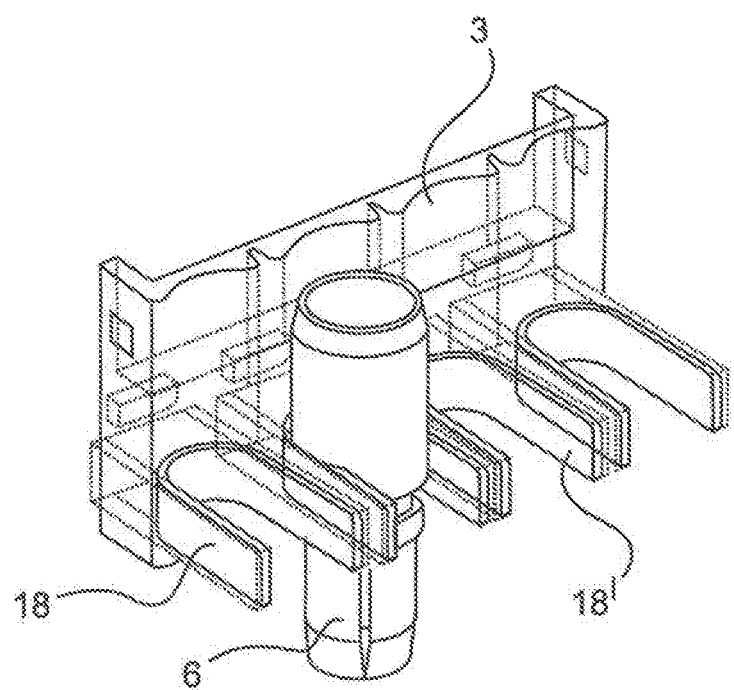
FIG. 8 illustrates a perspective view of the first lateral part having integrated metal shield strips, wherein the first lateral part is illustrated in a transparent manner.

Soft-magnetic metal strips form the core of the shield arms 7. The soft-magnetic metal strips are not in electrical contact with the respective contact elements 6, 6', 6", 6'''. The metal core of the shield arms 7 is used to shield the magnetic field, which is produced at the contact elements, from the magnetic field of an adjacent contact element. As a result, different measurement ranges are created for the sensor for measuring the current. In addition, the magnetic fields that are to be measured are intensified. The metal shield strips 18 or shield arms 7 also still have in this case a dual function. As is apparent in FIG. 8, the individual contact elements 6, 6', 6", 6''' may be locked in the insulating body 1 by the shield arms 7.

Figure 5:
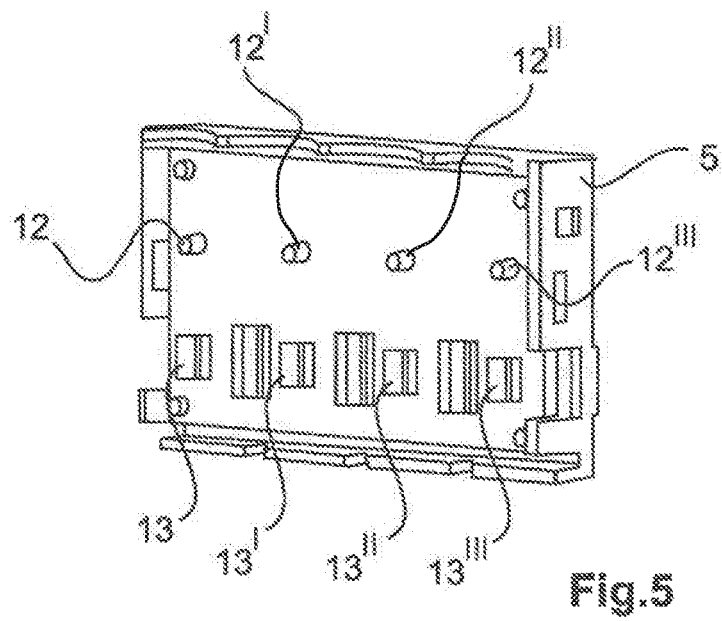
FIG. 5 illustrates a perspective view of the second lateral part thereof having an inserted circuit board.

With reference to FIG. 5, four sensors 13, 13', 13", 13''' that are allocated to the respective contact elements 6, 6', 6", 6''' are located on the circuit board 4. The sensors 13, 13', 13", 13''' may be Hall sensors.

The measured current values or their data may be tapped in a different manner and the procedure is not explained in detail.

Figure 6:
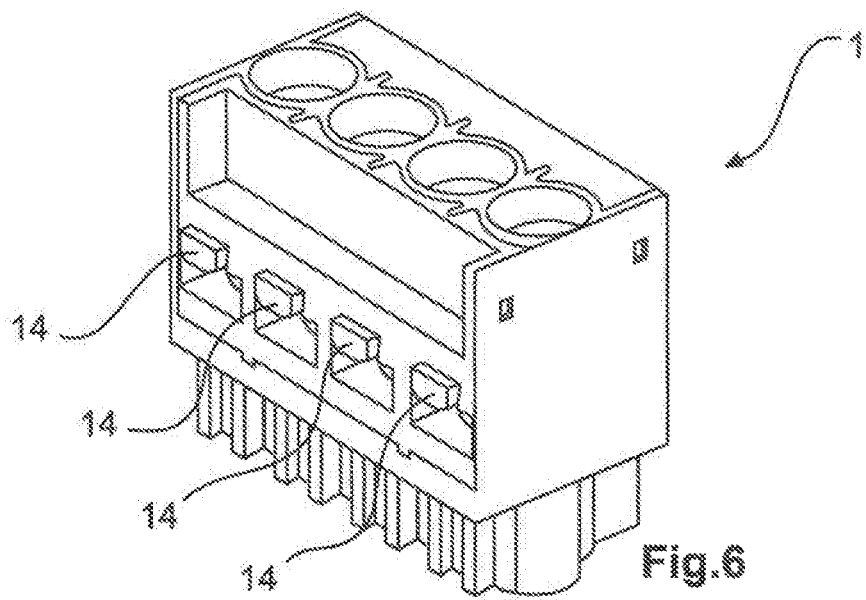
FIG. 6 illustrates a perspective view of the insulating body in an assembled state.
Figure 7:
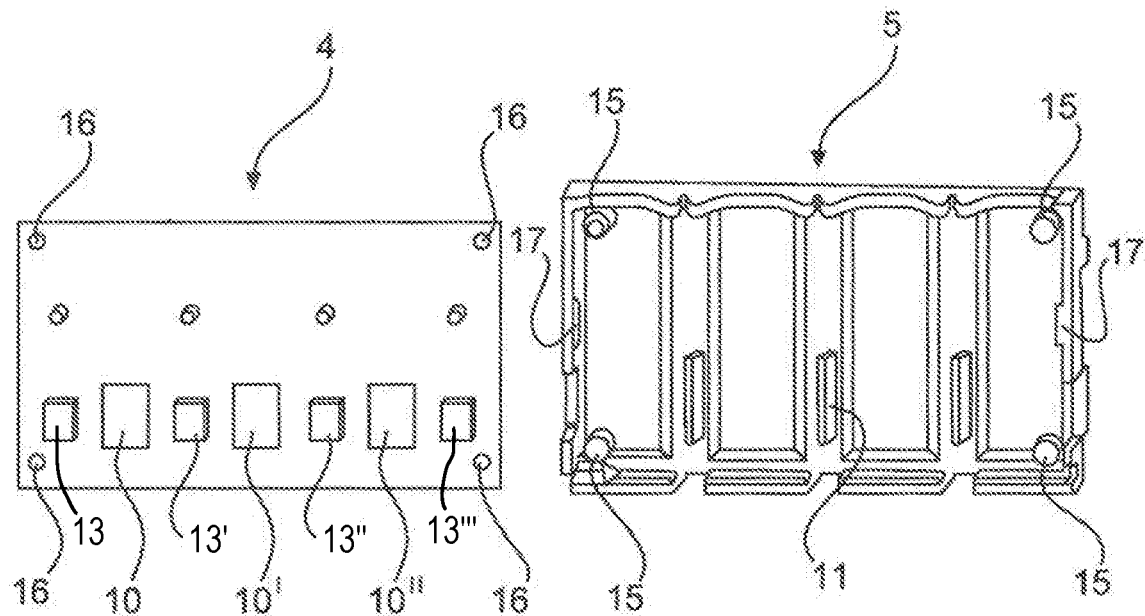
FIG. 7 illustrates a plan view of the circuit board and the second lateral part separated from each other.

With reference to FIG. 6, connecting pieces 14 may be formed as an integral part on both sides of the insulating body 1 and it is possible using said connecting pieces 14 to fix the insulating body 1 in a holding frame (not illustrated) of an industrial plug connector. The connecting pieces 14 may be formed as an integral part on the outside of the lateral parts 3, 5 of the insulating body 1.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A connector module for a plug connector, wherein the connector module comprises:
   a base body having cut-outs;
   a first lateral part having at least two shield arms that protrude in a perpendicular manner from the first lateral part, the shield arms engaging through the cut-outs in the base body and the shield arms having a metal core;
   a second lateral part;
   at least two electrical contact elements; and
   at least two sensors for measuring current, wherein each sensor is allocated to a respective one of the electrical contact elements.

2. The connector module as claimed in claim 1 wherein the sensors are shielded from one another in an electromagnetic manner by the shield arms.

3. The connector module as claimed in claim 1 wherein the at least two sensors are each a Hall sensor.

4. The connector module as claimed in claim 1 wherein the connector module is provided with at least one connecting piece as an integral part, which enables the connector module to be fastened in a holding frame of an industrial plug connector.

5. The connector module as claimed in claim 1 wherein the connector module further comprises a circuit board.

6. The connector module as claimed in claim 5 wherein:
   the circuit board comprises cut-outs; and
   the shield arms of the first lateral part in each case engage through a respective one of the cut-outs of the circuit board.

7. The connector module as claimed in claim 5 wherein the sensors are mounted on the circuit board.

8. The connector module as claimed in claim 5 wherein the circuit board is aligned parallel to the electrical contact elements.

9. A connector module for a plug connector, wherein the connector module comprises:
   a base body having cut-outs;
   a first lateral part having at least four shield arms that protrude in a perpendicular manner from the first lateral part, and wherein in each case two shield arms are combined together to form a shield arm pair;

a second lateral part having connecting pieces, the shield arm pairs engaging with the connecting pieces of the second lateral part through the cut-outs in the base body;
at least two electrical contact elements; and
at least two sensors for measuring current, wherein each sensor is allocated to a respective one of the electrical contact elements.

\* \* \* \* \*